United States Patent
Kao

(10) Patent No.: US 8,357,552 B2
(45) Date of Patent: Jan. 22, 2013

(54) LIGHT EMITTING DIODE CHIP, AND METHODS FOR MANUFACTURING AND PACKAGING THE SAME

(75) Inventor: Chih-Chiang Kao, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 234 days.

(21) Appl. No.: 12/654,005

(22) Filed: Dec. 8, 2009

(65) Prior Publication Data
US 2010/0210046 A1 Aug. 19, 2010

(30) Foreign Application Priority Data
Feb. 19, 2009 (CN) .......................... 2009 1 0037346

(51) Int. Cl.
*H01L 21/00* (2006.01)
(52) U.S. Cl. .................. 438/29; 438/26; 257/E21.158
(58) Field of Classification Search .................. 438/26, 438/29; 257/E21.158
See application file for complete search history.

(56) References Cited

U.S. PATENT DOCUMENTS

| 2006/0214173 A1* | 9/2006 | Beeson et al. ................. 257/88 |
| 2010/0237368 A1* | 9/2010 | Kojima et al. ................. 257/98 |

FOREIGN PATENT DOCUMENTS

| JP | 08-46279 | * 11/1996 |
| JP | 2008-130875 | * 11/2006 |
| JP | 2008-130875 | 6/2008 |

* cited by examiner

*Primary Examiner* — Eugene Lee
*Assistant Examiner* — Elias M Ullah
(74) *Attorney, Agent, or Firm* — Rosenberg, Klein & Lee

(57) ABSTRACT

A light emitting diode chip includes a substrate, an epitaxial layer, two inclined plane units, and two electrode units. The substrate has top and bottom surfaces. The epitaxial layer is disposed on the top surface of the substrate. Each of the inclined plane units is inclined downwardly and outwardly from the epitaxial layer toward the bottom surface of the substrate, and includes an inclined sidewall formed on the epitaxial layer, and a substrate inclined wall formed on the substrate. Each of the electrode units includes an electrode disposed on the epitaxial layer, and a conductive portion extending from the electrode to the substrate inclined wall along corresponding one of the inclined plane units.

13 Claims, 16 Drawing Sheets

LIGHT EMITTING DIODE CHIP, AND METHODS FOR MANUFACTURING AND PACKAGING THE SAME

CROSS-REFERENCE TO RELATED APPLICATION

This application claims priority of Chinese application no. 200910037346.8, filed on Feb. 19, 2009.

BACKGROUND OF THE INVENTION

1. Field of the Invention

This invention relates to a light emitting diode chip, which has small package volume and which can be rapidly manufactured, and methods for manufacturing and packaging the light emitting diode chip.

2. Description of the Related Art

As shown in FIG. 1, a conventional light emitting diode chip 91 is electrically connected to external electrodes 93 on a substrate 92 by a wire bonding process. However, a larger space on the substrate 92 is required for the wire bonding process. In addition, since wire connections are made one by one using a machine during the wire bonding process, the production efficiency is relatively low and is unfavorable for a system in package or a wafer level package.

In order to alleviate the problems attributed to the wire bonding process, a flip chip process is commonly used for replacing the wire bonding process. However, in the flip chip process, there is a need to deposit plenty of gold bumps on each chip, which is time-consuming and also decreases the packaging process efficiency of the chip. Aside from the flip chip process, other packaging methods without using the wire bonding process are also proposed. For example, the chip can be flipped such that the electrodes on the chip are directly mounted onto the electrodes on the substrate without providing the gold bumps therebetween. However, in packaging method, those electrodes on the chip should be formed equally in height to have an excellent flatness. Therefore, the precision requirement for the electrodes is relatively high, and it is relatively difficult to manufacture the chips for such packaging method. Furthermore, another packaging method by modifying the structure of the chip has been proposed heretofore. According to this method, the electrodes of the chip extend from a top surface of the chip to a bottom surface thereof. For example, a method of making a chip disclosed in JP 2008-130875, as shown in FIGS. 2 and 3, includes: forming a via hole 941 in a chip 94, followed by forming a conductive layer 95 for electrically connecting an electrode 96 on a top surface of the chip 94 to an electrode 97 on a bottom surface of the chip 94. Therefore, the electrode 97 of the chip 94 can be provided on the bottom surface of the chip 94. However, in the case of JP 2008-130875, the via hole 941 defines a vertical via-hole sidewall. When forming the conductive layer 95 along the vertical via-hole sidewall, it is likely to result in a poor step coverage (non-uniform surface coverage) of the via-hole sidewall and a poor conductivity of the conductive layers.

SUMMARY OF THE INVENTION

In order to solve the above-mentioned problems, a light emitting diode chip, methods for making and packaging the light emitting diode chip, a package structure of the light emitting diode, and a method for making a reflective cup used for packaging the light emitting diode chip are provided in the present invention.

According to the present invention, a light emitting diode chip is provided with two inclined sidewalls on two sides thereof. Due to the inclined sidewalls, it is easy to deposit the conductive portions evenly on the inclined sidewalls, thereby avoiding a problem of poor step coverage. Furthermore, with the conductive layers on the inclined sidewalls, connections of the electrodes of the light emitting diode chip can be extended to two sides or the bottom side of the substrate. Such an arrangement facilitates subsequent packaging processes of the light emitting diode chip. Particularly, no wire bonding process is needed in this invention, and the package volume of the light emitting diode chip can be reduced.

The invention further provides methods of forming a reflective cup and packaging the light emitting diode for system in package or wafer level package. It merely requires one step photolithography process to form a cavity with a reflection layer. Compared to the prior art which requires two steps of photolithography, this invention reduces processing time and production cost. Furthermore, the packaging method of the invention does not need any wire bonding process to form a wiring connection with the package substrate, thereby saving the processing time, enhancing productivity, and reducing the package volume.

The invention further provides a packaging method in which connections of the electrodes on the light emitting diode chip can be extended to the lower surface of the package substrate without forming a via hole inside the reflective cup, thereby avoiding destruction to the sealing of the light emitting diode chip, and eliminating the problems of the prior art in that the chip is susceptible to moisture and the package structure is likely to be fragile due to the via hole in the reflective cup used for extending the electrode to a bottom of the package substrate. In addition, the package structure produced by the invention can be directly mounted on a printed circuit board of an application product without using the wire bonding process. Accordingly, the yield of defective products due to wire breakage can be reduced, the reliability of the package structure can be improved, and assembling of the package structure will be more simplified and more convenient for downstream application processes.

In the light emitting diode chip of the invention, by virtue of the inclined plane units, the conductive portions connected to the electrodes can be extended to the substrate inclined walls or the bottom surface of the substrate, and electrical connections can be formed directly by mounting the light emitting diode chip on the package substrate or by forming the conductive extension portions using a metallization process. Since there is no need to conduct the wire bonding process, it facilitates the utilization of the light emitting diode chip in a system in package or wafer level package, saves the time for wire bonding, and saves the space for wire bonding to reduce the packaging volume. Besides, the light emitting diode chip is advantageous to miniaturize other photoelectric devices, and is more flexible for integration with other LED technologies, such as nano-crystal coating process. In addition, by forming the inclined sidewalls and the substrate inclined walls and by depositing the conductive portion on the inclined faces thereof, it is easier to control the deposition on the inclined faces, compared to the vertical via-hole sidewall in the prior art. Thus, a yield rate of the light emitting diode chip can be improved, and the cost thereof can be reduced.

In the method for making a reflective cup according to this invention, by protruding the portion of the protection portion adjacent to the cavity, the metal layer formed in the cavity does not extend out of the opening of the cavity, thereby eliminating one photolithography step and saving the processing time and production costs.

In the method for packaging the light emitting diode provided in this invention, the plurality of light emitting diode chips can be packaged on the same package substrate without using the wire bonding process. Thus, the packaging method is suitable for use in a system in package or wafer, level package. Based on the package structure of the light emitting diode, a proper method for packaging can be selected such that the conductive portions connected to the electrodes of the light emitting diode chip can be extended out of the opening of the reflective cup, or be extended to the lower surface of the package substrate. Therefore, the light emitting diode chip can be provided with a perfect sealing. By such packaging method, not only can the processing time and the packaging volume be reduced, it is also convenient for the assembling processes in downstream applications.

BRIEF DESCRIPTION OF THE DRAWINGS

Other features and advantages of the present invention will become apparent in the following detailed description of the five preferred embodiments of the invention, with reference to the accompanying drawings, in which.

DETAILED DESCRIPTION OF THE PREFERRED EMBODIMENTS

Figure 1:
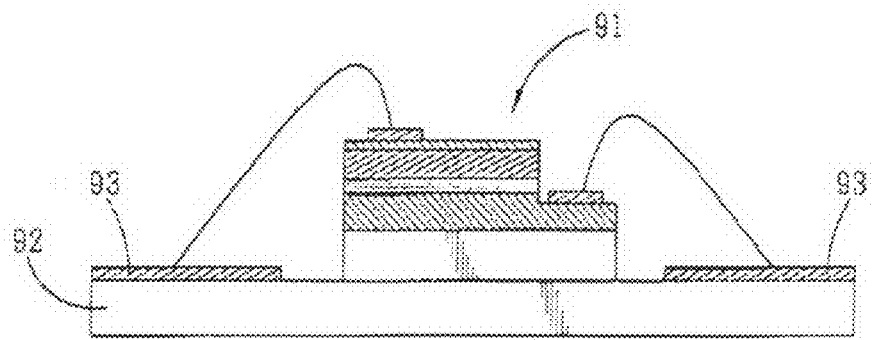
FIG. 1 is a schematic side view of a conventional light emitting diode chip.
Figure 2:
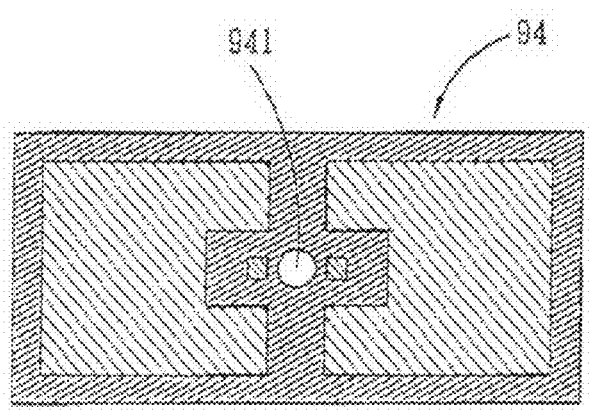
FIG. 2 is a top view of a light emitting diode chip disclosed in JP 2008-130875.
Figure 3:
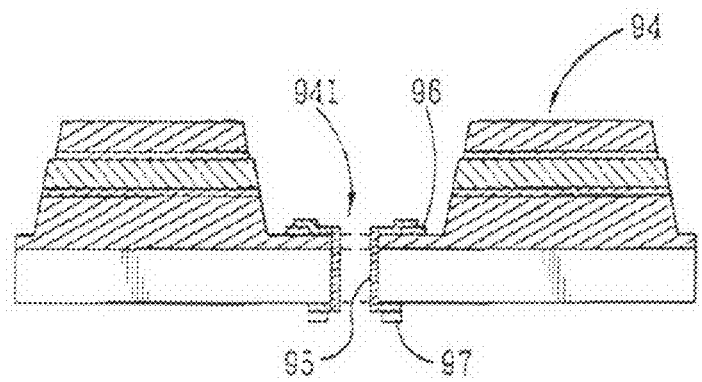
FIG. 3 is a cross-sectional view of FIG. 2.
Figure 4A:
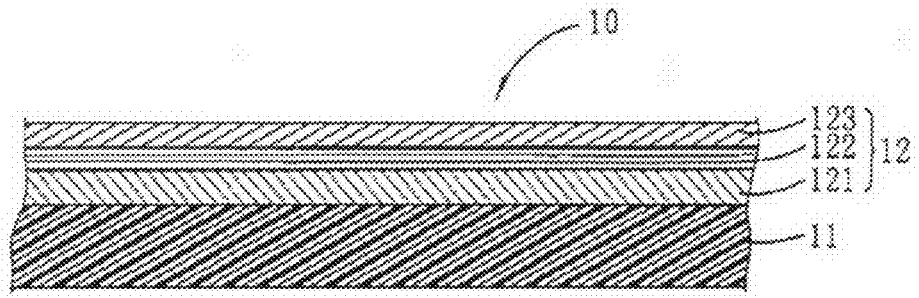
FIG. 4 (a) to FIG. 4 (f) are cross-sectional views illustrating steps of the method for making the light emitting diode chip according to the first embodiment of the present invention.
Figure 4B:
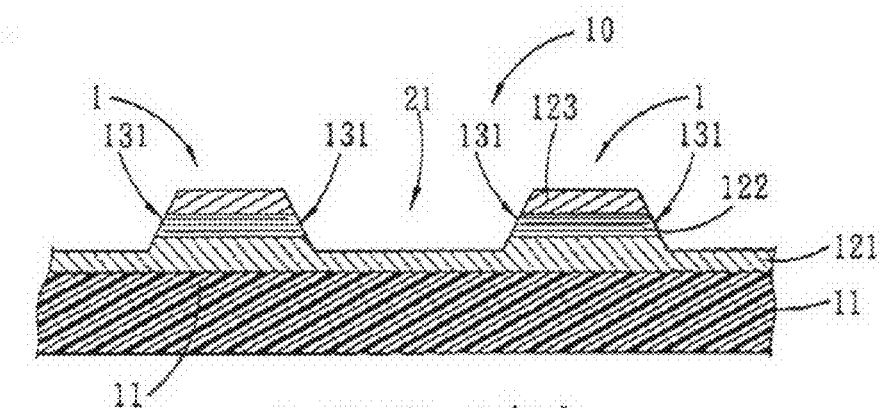
Figure 4C:
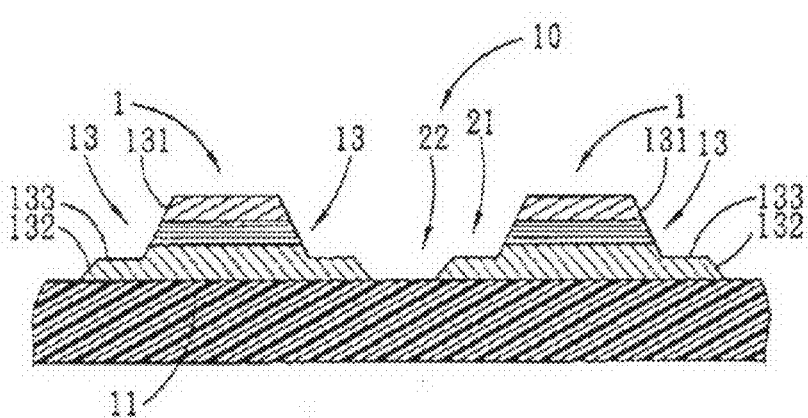
Figure 4D:
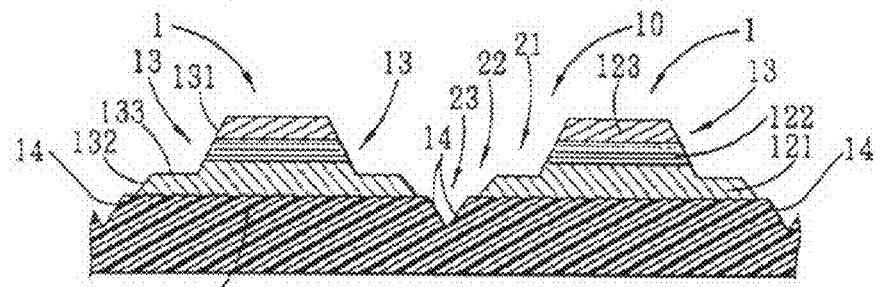
Figure 4E:
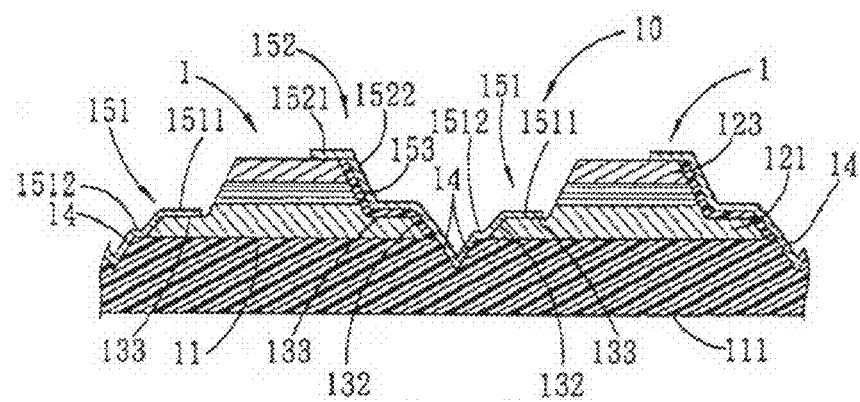
Figure 4F:
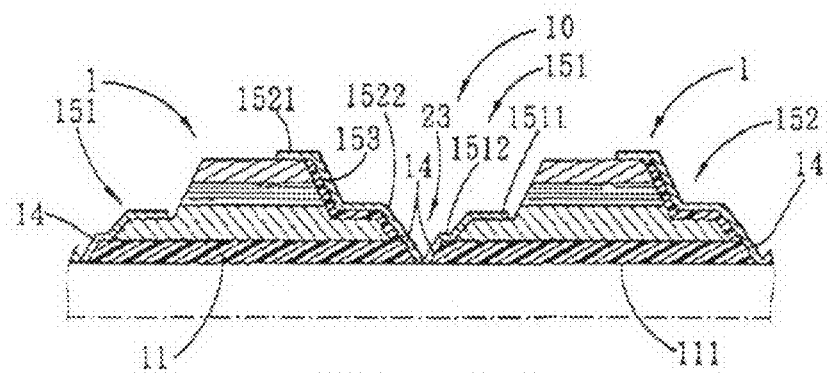

Before the present invention is described in greater detail with reference to the accompanying preferred embodiments, it should be noted herein that like elements are denoted by the same reference numerals throughout the disclosure.

Referring to FIG. 4 (a) to FIG. 4 (f), the steps included in the method for making the light emitting diode chip 1 according to the first embodiment of the present invention are described as follows.

As shown in FIG. 4 (a), a mother chip 10 formed with an epitaxial structure is provided. The mother chip 10 comprises a substrate 11 and an epitaxial layer 12 formed on the substrate 11. The epitaxial layer 12 includes: a first type semiconductor layer 121 formed on the substrate 11, a light emitting layer 122 formed on the first type semiconductor layer 121, and a second type semiconductor layer 123 formed on the light emitting layer 122. In this embodiment, the substrate 11 is made of sapphire, and has a thickness of approximately 350 μm. The first type semiconductor layer 121 is made of n-GaN, and the second type semiconductor layer 123 is made of p-GaN.

Using a patterning process of semiconductor processing technologies, a plurality of predetermined chip positions (not shown) and recesses (each of which is disposed between two chips) are defined on the mother chip 10. How substrate inclined walls and electrode units are formed by etching and metallization processes will be described as following. For simplicity, only two adjacent chips are illustrated in the figures. As shown in FIG. 4 (b), at a predetermined position, a first recess 21 having an outwardly expanding opening is formed by performing an etching process from the second type semiconductor layer 123 to a portion of the first type semiconductor layer 121 until the first type semiconductor layer 121 is partially exposed. That is to say, within the first recess 21, one side of each chip 1 is formed with the first inclined surface 131 that extends downwardly from a side of the second type semiconductor layer 123 to a part of a side of the first type semiconductor layer 121. As shown in FIG. 4 (c), on a bottom surface of each first recess 21 that is disposed between two adjacent chips 1, i.e., the place where the first type semiconductor layer 121 is partially exposed, a predetermined position of a second recess 22 is defined. Then, the first type semiconductor layer 121 is etched until parts of the substrate 11 are exposed, such that the second recess 22 with an outwardly expanding opening is formed and such that the side of each chip 1 is further formed with a second inclined surface 132. The second inclined surface 132 is formed on a remaining part of the side of the first type semiconductor layer 121 in proximity to the substrate 11. In addition, the first inclined surface 132 and second inclined surface 132 are preferred in parallel. Furthermore, a shoulder face 133 is formed on the first type semiconductor layer 121 to interconnect the first and second inclined surfaces 131, 132 in the same step of etching first type semiconductor layer 121. The first and second inclined surfaces 131, 132 and the shoulder face 133 cooperatively form one inclined sidewall 13 of the epitaxial layer 12, which is inclined downwardly and outwardly of each chip 1. On another side of each chip 1, the other first and second recesses 21, 22 are also formed in combination with corresponding inclined sidewalls 13. The aforesaid etching process can be a dry or wet etching process, depending on the material of the epitaxial layer 12. Since the selection of the etching processes is well known in the art, a description thereof is omitted below. It should be noted that the steps for forming the first and second recesses 21, 22 described hereinabove are only one of the examples usable in the present invention. The positions of the first and second recesses 21, 22 can also be defined simultaneously by using photoresist layers with varying thicknesses or by using a halftone process, and the first and second recesses 21, 22 can be formed by one-step etching or two-step etching. The steps for forming the first and second recesses 21, 22 should not be limited to the aforesaid examples.

According to another mask design of the photolithographic process, one side of each chip 1 is formed as a continuous inclined sidewall formed with the first inclined surface 131 that extends downwardly from a side of the second type semiconductor layer 123 to a part of a side of the first type semiconductor layer 121 and the second inclined surface 132 formed on a remaining part of the side of the first type semiconductor layer 121 in proximity to the substrate 11. Another side of each chip 1 is as formed a stepped inclined sidewall formed with the first inclined surface 131, the second inclined surface 132 and the shoulder face 133 formed on the first type semiconductor layer 121 and interconnecting the first and second inclined surfaces 131, 132.

As shown in FIG. 4 (d), the bottom surface of the second recess 22, i.e., the exposed parts of the substrate 11, is etched to form a substrate cavity 23 which has an outwardly expanding opening. Accordingly, two substrate inclined walls 14 are respectively formed between the two chips 1 to be two sides of the substrate cavity 23 which are inclined with the direction same as that of respective adjacent inclined sidewall 13. There is one groove 23 with inclined side wall which has the same inclined direction with respective adjacent sidewall 13 existed between chips 1. The etching process at this stage can also be a dry or wet etching process. In an embodiment, a wet etching is used, which utilizes a heated mixture of phosphoric acid and water to etch the substrate 11 so that an inclining angle of the substrate inclined wall 14 ranges from 40° to 60°.

Figure 5:
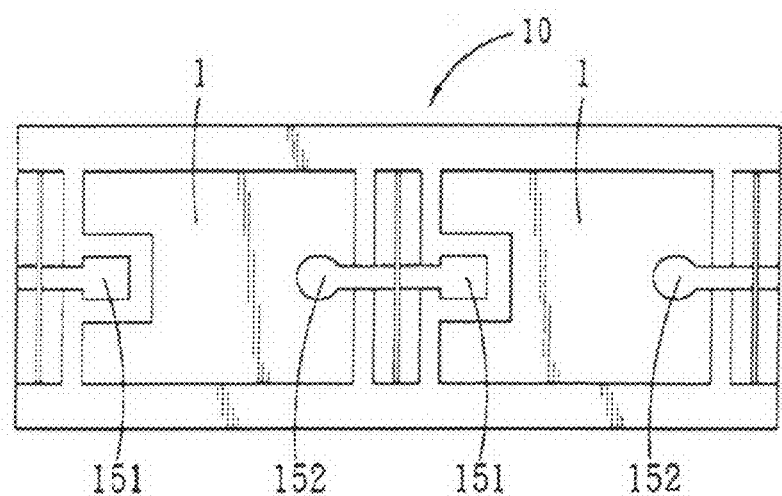
FIG. 5 is a top view of FIG. 4 (f) for illustrating positions of two electrode units of the light emitting diode chip in the first embodiment.

As shown in FIG. 4 (e), on each chip 1, two electrode units are formed thereon by a metallization process. The two electrode units 151, 152 of each chip 1 include a first electrode unit 151 electrically connected to the first type semiconductor layer 121, and a second electrode unit 152 electrically connected to the second type semiconductor layer 123. The first electrode unit 151 of each chip 1 includes an electrode 1511 and a first conductive portion 1512. The electrode 1511 is disposed on the shoulder face 133 of the inclined sidewall 13 on the side of the chip 1. The first conductive portion 1512 extends from the electrode 1511 to the substrate inclined wall 14 along the second inclined surface 132 on the side of the chip 1. The second electrode unit 152 of each chip 1 includes an electrode 1521 and a first conductive portion 1522. The electrode 1521 is disposed on the second type semiconductor layer 123. The first conductive portion 1522 extends from the electrode 1521 to the substrate inclined wall 14 along the inclined sidewall 13 on another side of the chip 1. In addition, an insulating layer 153 is formed beforehand between the first conductive portion 1522 and the corresponding inclined sidewall 13 in order to prevent short-circuiting. The distribution of the first and second electrode units 151, 152 on each chip 1 can be seen in the top view in FIG. 5.

Before forming the electrode 1521, a transparent electrode (not shown), such as an indium tin oxide (ITO) film, can be formed on the second type semiconductor layer 123 to increase uniformity of conductivity.

As shown in FIG. 4 (f), a bottom surface of the substrate 11, which is opposite to the epitaxial layer 12, is polished until polishing to expose each substrate cavity 23 so that the first conductive portions 1512, 1522 are exposed from the polished bottom surface 111. In this embodiment, the substrate 11 is polished to have a thickness ranging from 50 to 100 µm. Thereafter, the mother chip 10 is cut into several independent chips 1.

Figure 6:
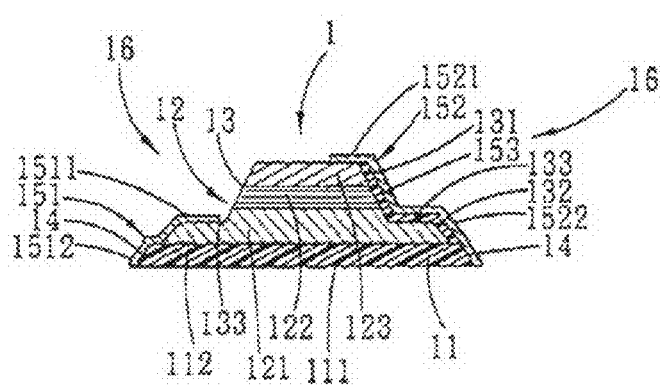
FIG. 6 is a cross-sectional view illustrating the light emitting diode chip according to the first embodiment of the present invention.
Figure 7A:
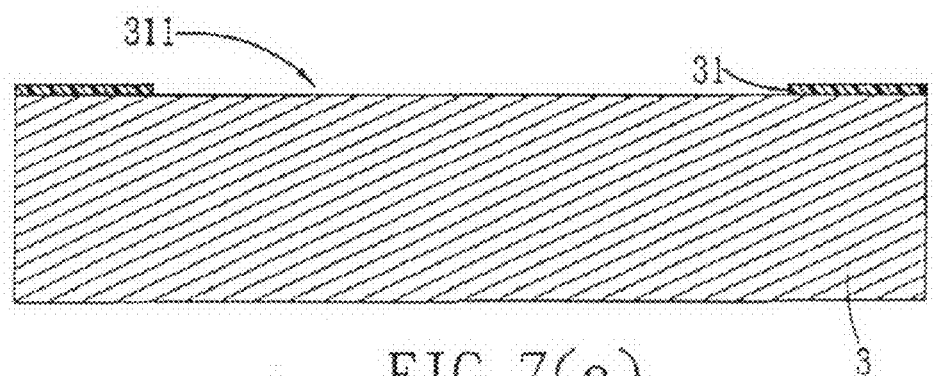
FIG. 7 (a) to FIG. 7 (g) are cross-sectional views illustrating steps of the method for packaging the light emitting diode according to the first embodiment of the present invention.
Figure 7B:
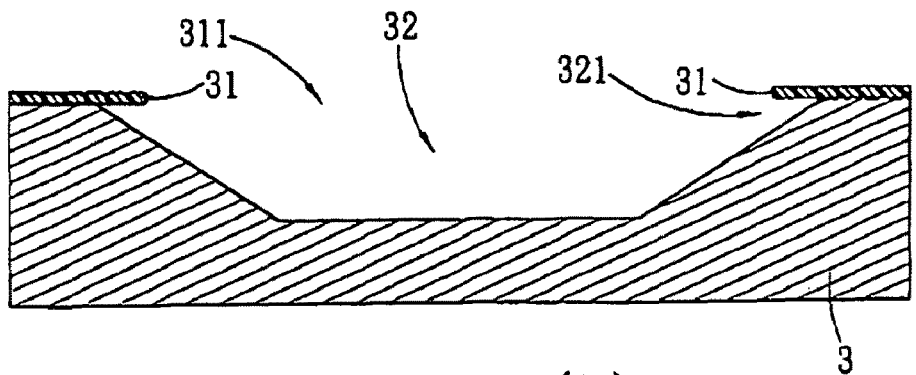
Figure 7C:
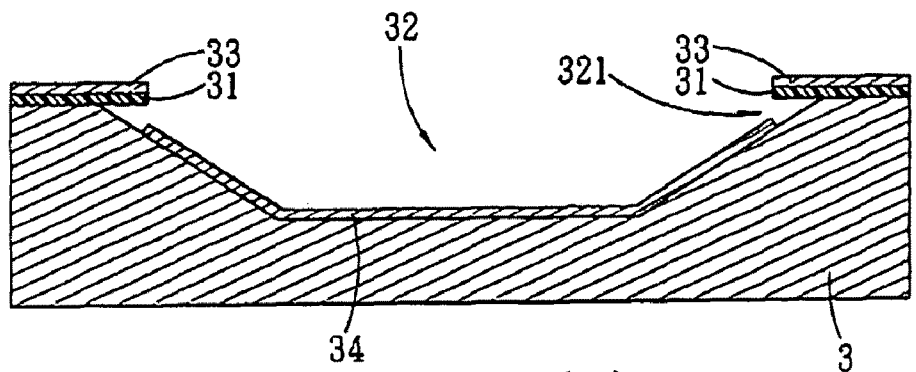
Figure 7D:
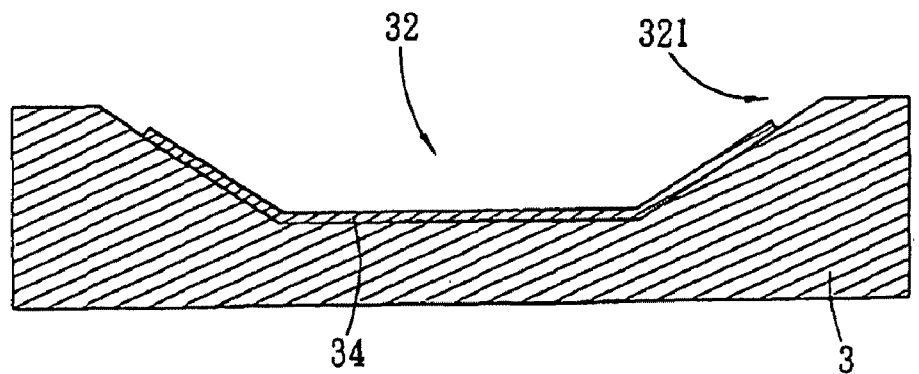
Figure 7E:
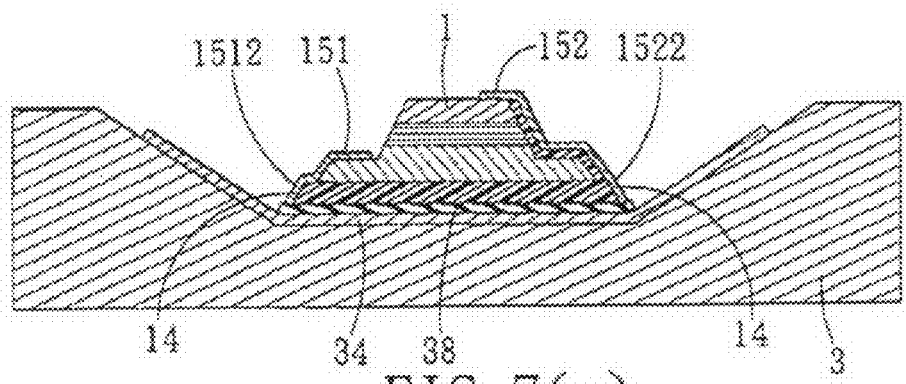
Figure 7F:
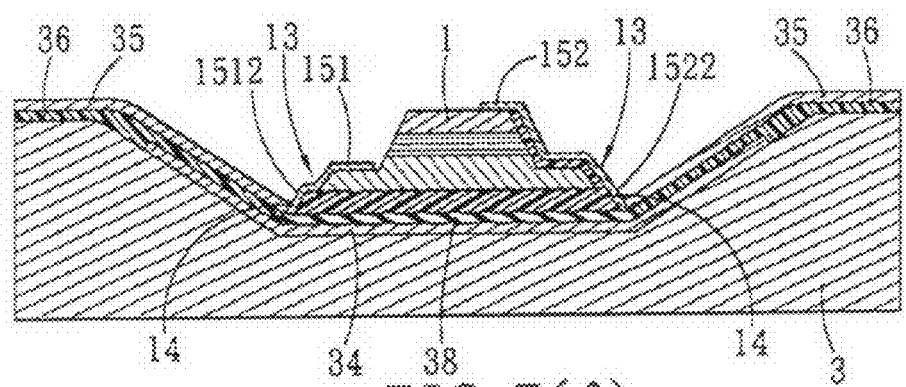
Figure 7G:
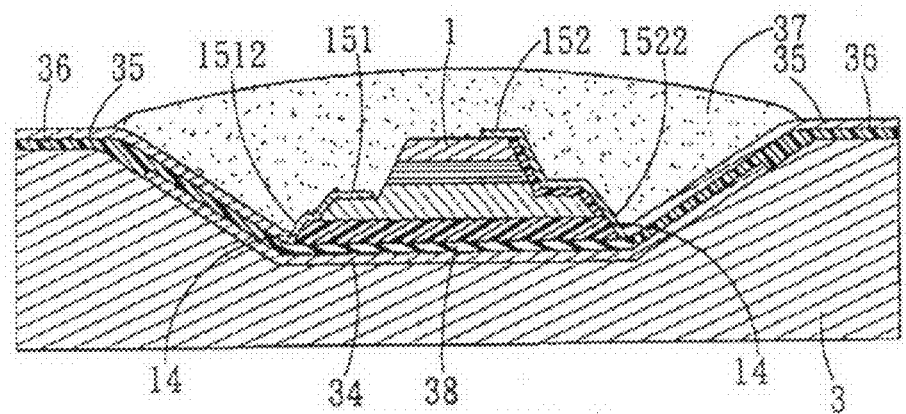

Take FIG. 6 as example, the chip 1 made by the aforesaid steps is the light emitting diode chip of the first embodiment, which includes: a substrate 11, an epitaxial layer 12, two inclined plane units 16, and two electrode units 151, 152. The substrate 11 has top and bottom surfaces 112 and 111. The epitaxial layer 12 is disposed on the top surface 112 of the substrate 11, and includes a first type semiconductor layer 121, a light emitting layer 122, and a second type semiconductor layer 123. The first type semiconductor layer 121 is disposed on the top surface 112 of the substrate 11. The light emitting layer 122 is disposed between the first and second type semiconductor layers 121, 123. The two inclined plane units 16 are opposite to each other, and are respectively inclined downwardly and outwardly from the epitaxial layer 12 toward the bottom surface 111 of the substrate 11. Each of the inclined plane units 16 includes an inclined sidewall 13 formed on the epitaxial layer 12, and a substrate inclined wall 14 formed on the substrate 11.

As shown as in FIG. 6, these two inclined plane units 16 are symmetrical and the inclined sidewalls 13 of corresponding inclined plane units 16 are symmetrical. The inclined sidewall 13 of each inclined plane unit 16 includes: a first inclined surface 131 extending downwardly from a side of the second type semiconductor layer 123 to a part of a side of the first type semiconductor layer 121, a second inclined surface 132 formed on a remaining part of the side of the first type semiconductor layer 121 in proximity to the substrate 11, and a shoulder face 133 interconnecting the first and second inclined surfaces 131, 132 and disposed on the first type semiconductor layer 121. The two electrode units 151, 152 include a first electrode unit 151 electrically connected to the first type semiconductor layer 121, and a second electrode unit 152 electrically connected to the second type semiconductor layer 123. The first electrode unit 151 includes an electrode 1511 and a first conductive portion 1512. The electrode 1511 is disposed on the shoulder face 133 of corresponding one of the inclined plane units 16. The first conductive portion 1512 extends from the electrode 1511 to the substrate inclined wall 14 along the second inclined surface 132 of the corresponding one of the inclined plane units 16. The second electrode unit 152 includes an electrode 1521 and a first conductive portion 1522. The electrode 1521 is disposed on the second type semiconductor layer 123. The first conductive portion 1522 extends from the electrode 1521 to the substrate inclined wall 14 along the inclined sidewall 13 of the other inclined plane unit 16. Furthermore, an insulating layer 153 is formed beforehand between the first conductive portion 1522 and the corresponding inclined sidewall 13. Besides, the substrate 11 can be made from an electrically conductive material, and, in case of the use of the conductive substrate, insulating layers (not shown) should be provided on the substrate inclined walls 14. In this embodiment, an inclined angle of the substrate inclined wall 14 ranges from 40° to 60°.

In another embodiment, these two inclined plane units 16 are asymmetrical and the inclined sidewalls 13 of corresponding inclined plane units 16 are asymmetrical. In the other words, each of the inclined sidewall 13 of the inclined plane unit 16 includes a first inclined surface 131 extending downwardly from a side of the second type semiconductor layer 123 to a part of a side of the first type semiconductor layer 121, a second inclined surface 132 formed on a remaining part of the side of the first type semiconductor layer 121 in proximity to the substrate 11. However, one of the inclined sidewalls 13 further includes a shoulder face 133 interconnecting the first and second inclined surfaces 131, 132 and disposed on the first type semiconductor layer 121. In addition, the first inclined surface 131 and the second inclined surface 132 in parallel, preferably.

Furthermore, the first inclined surface 131 and the second inclined surface 132 of the inclined side walls 13 without the shoulder face 133 can be seem as a continuous plane. In this case, a first electrode unit 151 forms on one of the inclined side walls 13 with the shoulder face 133 so as to electrically connect to the first type semiconductor layer 121, and a second electrode unit 152 forms on another of the inclined side walls 13 without the shoulder face 133 so as to electrically connect to the second type semiconductor layer 123. The first electrode unit 151 includes an electrode 1511 disposed on the shoulder face 133 and a first conductive portion 1512 extending from the electrode 1511 to the substrate inclined wall 14 along the second inclined surface 132. Furthermore, an insulating layer 153 is formed on the corresponding inclined sidewall 13 without the shoulder face 133 (not shown). The second electrode unit 152 includes an electrode 1521 disposed on the second type semiconductor layer 123 and a first conductive portion 1522 extending from the electrode 1521 and formed on the insulating layer 153. In this embodiment, an inclined angle of the substrate inclined wall 14 ranges from 40° to 60°.

By such, it is beneficial for forming conductive extension portions on a packaging substrate to electrically connect with the first conductive portions 1512, 1522 during the packaging of the chip 1. The details will be described hereinafter.

FIG. 7 (a) to FIG. 7 (g) illustrate a method for packaging the light emitting diode according to the first embodiment of the present invention. FIG. 7 (a) to FIG. 7 (d) further illustrate a method for making a reflective cup. As shown in FIG. 7 (a), a protection portion 31 is formed on a package substrate 3, and then, the protection portion 31 is patterned to form a through hole 311 penetrating the protection portion 31. In this embodiment, the package substrate 3 is made of silicon, and the protection portion 31 is made of $SiN_x$. The package substrate 3 can be made of any other nonconductor such as aluminum nitride, aluminum oxide, or other ceramic materials. The protection portion 31 can also be made of $SiO_x$, $SiN_x/SiO_x$, or other metals (for example, Ni, Au, etc.), and can be formed by an appropriate method based on the selected material. For example, when the protection portion 31 is made of a nonmetal material, it can be made by chemical vapor deposition or by a high humidity and temperature furnace process. On the other hand, when the protection portion 31 is made of a metal material, it can be made by electroplating, sputtering, or a vapor deposition method.

As shown in FIG. 7 (b), using an etching agent, the package substrate 3 is etched from the through hole 311 to form a cavity 32 having an opening 321 with a size larger than that of the through hole 311, such that a portion of the protection portion 31 adjacent to the cavity 32 protrudes to the cavity 32 to shield partially the cavity 32. In this embodiment, the etching agent is a solution of potassium hydroxide (KOH). On the condition that the concentration of KOH is 30 vol % and the temperature is 80° C., or on the condition that the concentration of KOH is 45 vol % and the temperature is 85° C., the etching agent (KOH) has an etching rate of approximately 1 μm/min. The etching agent can be selected from other etching agents based on requirements, and should not be limited to that used in this embodiment.

As shown in FIG. 7 (c), a metal layer 33, 34 is formed on the protection portion 31 and in the cavity 32, and a portion (adjacent to the opening 321) of the cavity 32 shielded by the protection portion 31 is not covered by the metal layer 34. The metal layer 33, 34 can be made by sputtering or by a vapor deposition method, and can be made of Ti/Al, Ti/Ni/Ag, or other material that is commonly used to form a reflective layer.

As shown in FIG. 7 (d), the protection portion 31 and the metal layer 33 on the protection portion 31 are removed, and only the metal layer 34 is left in the cavity 32 to form a reflective cup 34. In the steps for forming the reflective cup 34, when the protection portion 31 is patterned, a one-step photolithography process is needed to define the position of the through hole 311. Thereafter, the protection portion 31 is used as a shield so that the metal layer 34 is not deposited on the portion of the cavity 32 that is adjacent to the opening 321. Thus, the reflective cup 34 will not extend out of the opening 321 of the cavity 32, and an additional photolithography process for defining an open region of the reflective cup 34 that does not extend beyond the opening 321 of the cavity 32 can be dispensed with.

As shown in FIG. 7 (e), the light emitting diode chip 1 produced as hereinabove described is mounted in the reflective cup 34. In detail, the light emitting diode chip 1 is mounting to the reflective cup 34 by using a chip-bonding adhesive 38. In this embodiment, the chip-bonding adhesive 38 is an insulating material so that the first conductive portion 1512 of the first electrode unit 151 and the first conductive portion 1522 of the second electrode unit 152 can be electrically isolated from the reflective cup 34.

As shown in FIG. 7 (f), by using a metallization process, two conductive extension portions 35 are formed to respectively connect to the first conductive portions 1512, 1522 of the first and second electrode units 151, 152 of the light emitting diode chip 1. In this embodiment, each conductive extension portion 35 is connected to the substrate inclined walls 14. Of course, each conductive extension portion 35 can also be connected to the inclined sidewalls 13. As such, connections of the first and second electrode units 151, 152 can extend to a part of the package substrate 3 outwardly of the reflective cup 34 by virtue of the two conductive extension portions 35. In this embodiment, because both of the reflective cup 34 and the package substrate 3 are conductive, it is necessary to form an insulating layer 36 on the reflective cup 34 and the package substrate 3 before the forming of the two conductive extension portions 35 in order to prevent the conductive extension portions 35 from contacting the reflective cup 34 and the package substrate 3. The insulating layer 36 corresponds in position to the two conductive extension portions 35. As shown in FIG. 7 (g), a light-transmissive encapsulant 37 is filled into the reflective cup 34 to encapsulate the light emitting diode chip 1. The light-transmissive encapsulant 37 can include or exclude fluorescent powder, based on user requirements.

Although the light emitting diode chip 1 of this embodiment is disposed in the reflective cup 34, the step of forming the conductive extension portions 35 can be used in a conventional package substrate or a conventional reflective cup.

Figure 8:
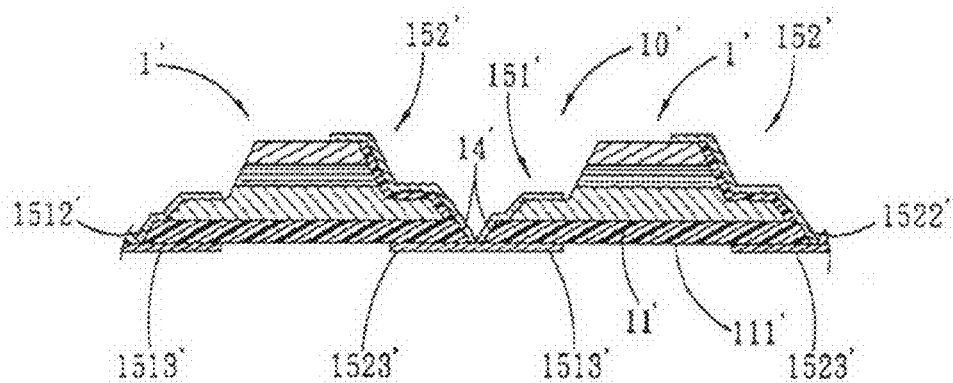
FIG. 8 is a cross-sectional view illustrating a step following the steps shown in FIG. 4 (a) to FIG. 4 (f) according to the method for making the light emitting diode chip of the second embodiment of the present invention.

The method for making the light emitting diode chip of the second embodiment of the present invention is substantially the same as that of the first embodiment. Reference is made to FIG. 4 (a) to FIG. 4 (f). The second embodiment differs from the first embodiment only in that, as shown in FIG. 8, after polishing a bottom surface of the substrate 11' to expose the first conductive portions 1512', 1522' from the polished bottom surface 111', two second conductive portions 1513', 1523' are formed on the polished bottom surface 111' of the substrate 11' by a metallization process such that the second conductive portions 1513', 1523' are respectively connected to the first conductive portions 1512', 1522' at positions where the first conductive portions 1512', 1522' respectively adjoin the substrate inclined walls 14'. Therefore, connections of the conductive portions 1512', 1513', 1522', 1523' of the first and second electrode units 151', 152' can be extended to the polished bottom surface 111' of the substrate 11'. Besides, before the metallization process, the polished bottom surface 111' can be further polished to have a flatter and smoother surface. Afterwards, the chips 1' on the mother chip 10' can be cut into several independent chips 1'.

Figure 9:
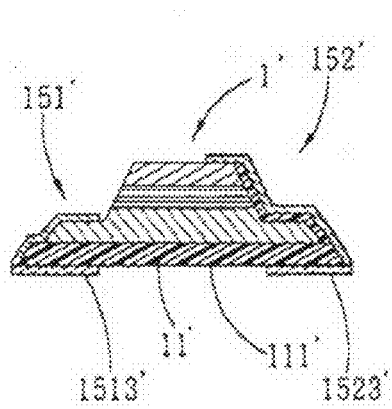
FIG. 9 is a cross-sectional view illustrating the light emitting diode chip according to the second embodiment of the present invention.

As shown in FIG. 9, the chip 1' made by the aforesaid steps is the light emitting diode chip 1' of the second embodiment, and is substantially the same as that of the first embodiment. The second embodiment differs from the first embodiment only in that the first electrode unit 151' further includes a second conductive portion 1513' extended to the bottom surface 111' of the substrate 11', and that the second electrode unit 152' further includes a second conductive portion 1523' extended to the bottom surface 111' of the substrate 11'.

Figure 10A:
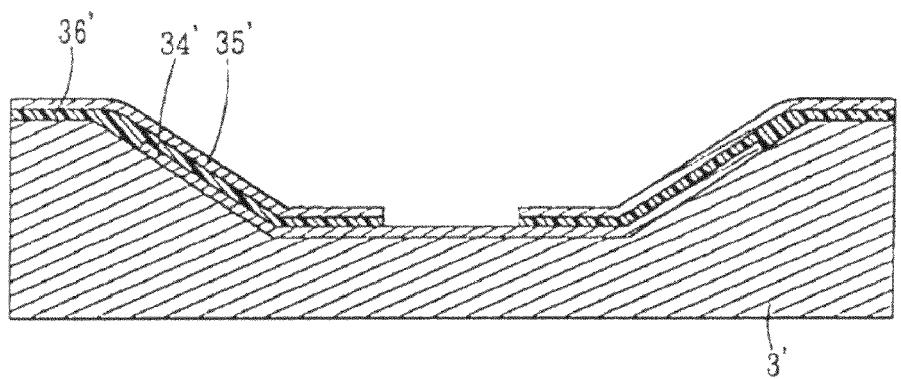
FIG. 10 (a) to FIG. 10 (c) are cross-sectional views illustrating steps following the steps shown in FIG. 7 (a) to FIG. 7 (d) according to the method for packaging the light emitting diode of the second embodiment of the present invention.
Figure 10B:
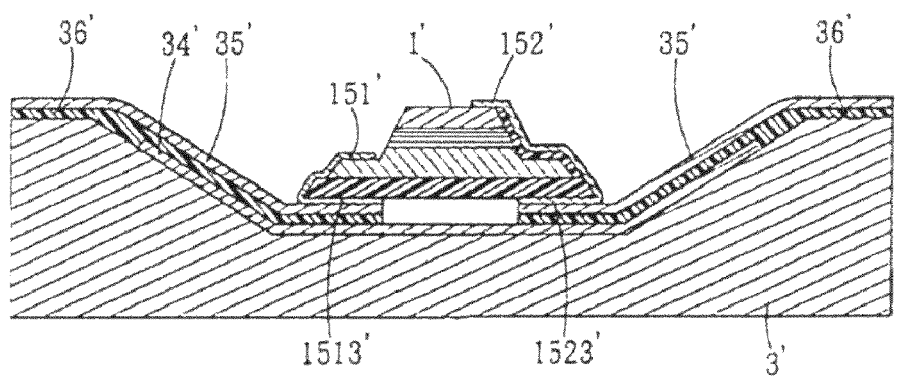
Figure 10C:
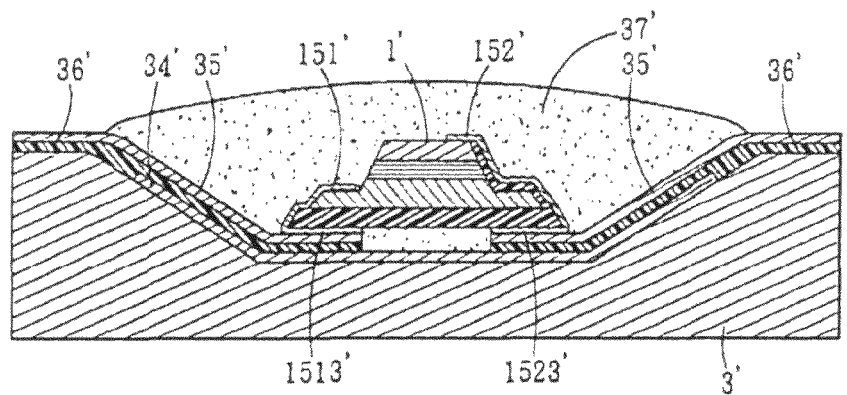
Figure 11A:
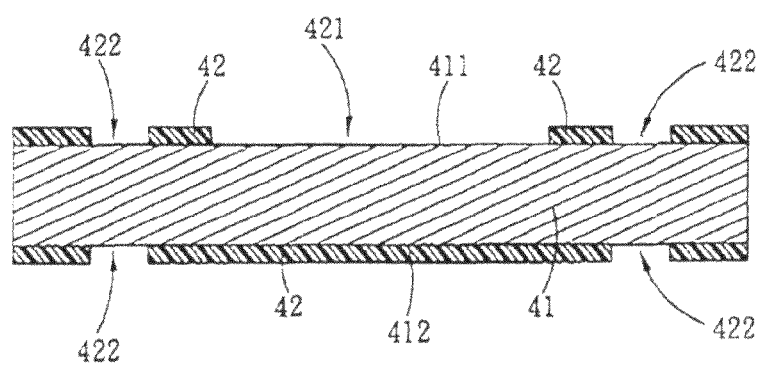
FIG. 11 (a) to FIG. 11 (f) are cross-sectional views illustrating steps of the method for packaging the light emitting diode according to the third embodiment of the present invention.
Figure 11B:
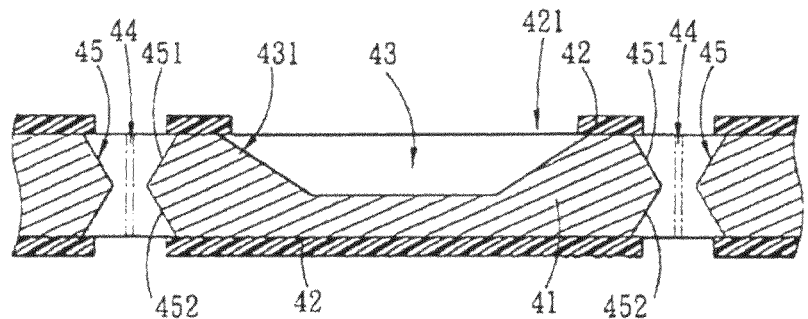
Figure 11C:
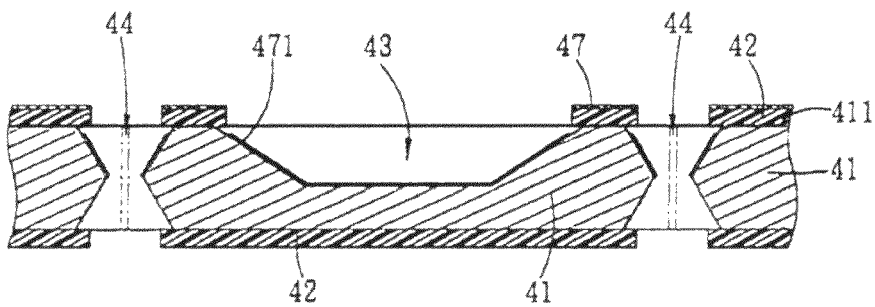
Figure 11D:
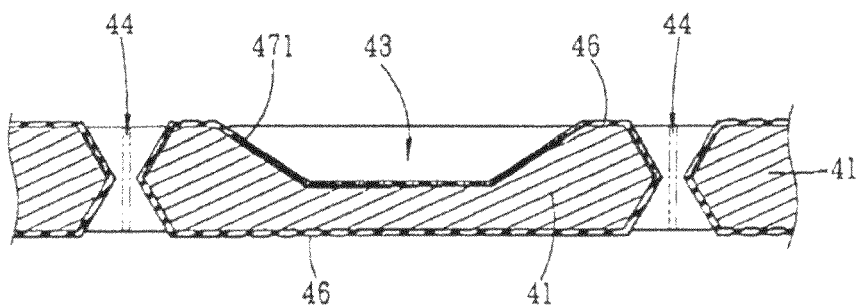
Figure 11E:
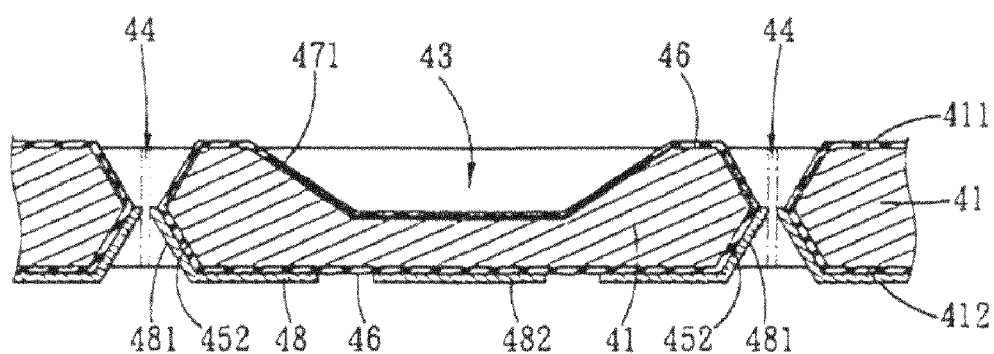
Figure 11F:
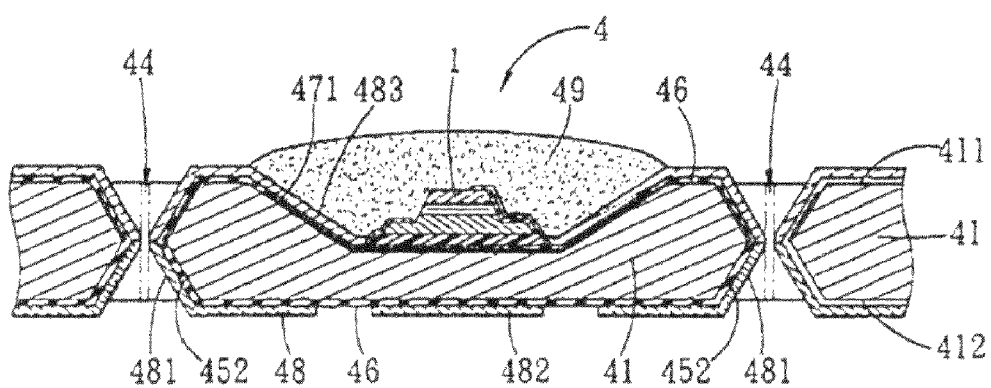

FIG. 10 (a) to FIG. 10 (c) illustrate steps of the method for packaging the light emitting diode of the second embodiment according to the present invention, which is used for packaging the aforesaid light emitting diode chip 1'.

As shown in FIG. 10 (a), after predetermined positions (not labeled) of the second conductive portions 1513', 1523' on the bottom surface 111' of the light emitting diode chip 1' (see FIGS. 8 and 9) are defined in the reflective cup 34', two conductive extension portions 35' are formed by a metallization process such that the conductive extension portions 35' extend to parts of the package substrate 3' outwardly of the reflective cup 34' from the predetermined positions of the second conductive portions 1513', 1523'. In this embodiment, the steps of the method used for making the reflective cup 34' are the same as those of the first embodiment shown in FIG. 7 (a) to FIG. 7 (d). Because both of the reflective cup 34' and the package substrate 3' are conductive, it is necessary to form an insulating layer 36' before the forming of the two conductive extension portions 35' in order to prevent the conductive extension portions 35' from contacting the reflective cup 34' and the package substrate 3'.

As shown in FIG. 10 (b), the light emitting diode chip 1' of the second embodiment is mounted fixedly in the reflective cup 34' such that the second conductive portions 1513', 1523' are respectively electrically connected to the two conductive extension portions 35'.

As shown in FIG. 10 (c), a light-transmissive encapsulant 37' is filled into the reflective cup 34' to encapsulate the light emitting diode chip 1'. The light-transmissive encapsulant 37' can include or exclude fluorescent powder, based on user requirements.

Although the light emitting diode chip 1' of this embodiment is disposed in the reflective cup 34', the step of forming the conductive extension portions 35' can be applied to a conventional package substrate or a conventional reflective cup.

FIG. 11 (a) to FIG. 11 (f) illustrate the method for packaging the light emitting diode of the third embodiment according to the present invention.

As shown in FIG. 11 (a), two protection portions 42 are respectively formed on upper and lower surfaces 411, 412 of the package substrate 41. The protection portions 42 are patterned to form a plurality of through holes 421, 422 predefining cavity locations 421 for the reflective cups 471 (see FIG. 11(c)), and predefining via-hole locations 422 for via holes 44 (see FIG. 11b) on two sides of each of the cavity locations 421. The via-hole locations 422 on the upper and lower surfaces 411, 412 of the package substrate 41 are aligned in a top-to-bottom direction. As shown in FIG. 11 (b), the package substrate 41 is etched by an etching agent through the through hole 421 of the protection portion 42 to form the cavity 43 that prelocates the reflective cup 471 (as shown in FIG. 11 (c)) such that an opening 431 of the cavity 43 is arranged to be larger than the through hole 421 and such that the protection portion 42 on the upper surface 411 of the package substrate 41 projects into the cavity 43. The two via holes 44 are also formed near the cavity 43 by etching the upper and lower surfaces 411, 412 of the package substrate 41 in opposite directions through the through holes 422. Each of the via holes 44 has a via-hole sidewall 45 for two adjacent packaging structures 4 (FIG. 11f). The via hole sidewall 45 has an upper inclined face 451 that tapers downwardly from the upper surface 411 of the package substrate 41 toward a middle part of a corresponding via hole 44, and a lower inclined face 452 that tapers upwardly from a lower surface 412 of the package substrate 41 toward the middle part of the corresponding via hole 44. In this embodiment, the package substrate 41 is made of silicon, and the materials used in the protection portions 42 and the etching step thereof are described in the first embodiment and will not be repeated herein.

As shown in FIG. 11 (c), a metal layer 47 is deposited on the upper surface 411 of the package substrate 41 such that the cavity 43 and the upper inclined faces 451 in the via holes 44 are covered by the metal layer 47. The metal layer 47 does not cover a portion of the cavity 43 in proximity to the protection portion 42 on the upper surface 411 of the package substrate 41. At this time, the reflective cup 471 is formed in the cavity 43.

As shown in FIG. 11 (d), the protection portions 42 on the upper and lower surfaces 411, 412 of the package substrate 41 are removed. Because the package substrate 41 is conductive, it is necessary to form an insulating layer 46 on the upper and lower surfaces 411, 412 of the package substrate 41 after removing the protection portions 42.

As shown in FIG. 11 (e), a conductive pattern 48 with predetermined patterns is formed on the lower surface 412 of the package substrate 41. The conductive pattern 48 for each packaging structure 4 (FIG. 11f) includes two lower conductive portions 481 and a conductive portion 482. Each lower conductive portion 481 extends from the lower surface 412 of the package substrate 41 to the corresponding lower inclined face 452 of the via hole 44. The conductive portion 482 is disposed on the lower surface 412 of the package substrate 41 for connecting an external heat sink (not shown). Alternatively, the conductive pattern 48 can be made by a lift-off process.

As shown in FIG. 11 (f), the light emitting diode chip 1 of the first embodiment is mounted in the reflective cup 471. Referring to FIG. 7 (e) to FIG. 7 (g), in this embodiment, the two conductive extension portions 35 of the first embodiment are extended to the corresponding upper inclined faces 451 in the two via holes 44 to form two upper conductive portions 483. The upper conductive portions 483 are correspondingly connected to the two lower conductive portions 481 and are also correspondingly connected to the first and second electrode units 151, 152. Accordingly, the connections of the first and second electrode units 151, 152 can extend to the lower surface 412 of the package substrate 41. Thereafter, a light-transmissive encapsulant 49 is filled into the reflective cup 471 to encapsulate the light emitting diode chip 1 to form the package structure 4. The light-transmissive encapsulant 49 can include or exclude fluorescent powder, based on user requirements. By the aforesaid steps, a plurality of package structures 4 can be formed on the same package substrate 41. The package substrate 41 can be subsequently cut into several independent package structures 4 each of which can be directly mounted on a printed circuit board of an application product (not shown) without using the wire bonding process. Therefore, such package structures 4 are beneficial for assembling processes in downstream applications.

In the packaging method disclosed in the third embodiment, the upper and lower conductive portions 483, 481 can be electrically interconnected via the via holes 44, thereby avoiding destruction to the sealing of the light emitting diode chip 1. Furthermore, the upper and lower conductive portions 483, 481 are respectively formed on the upper and lower inclined faces 451, 452. The inclined faces 451, 452 facilitate the deposition of the upper and lower conductive portions 483, 481 and thus improve the yield rate of the packaging method.

Figure 12A:
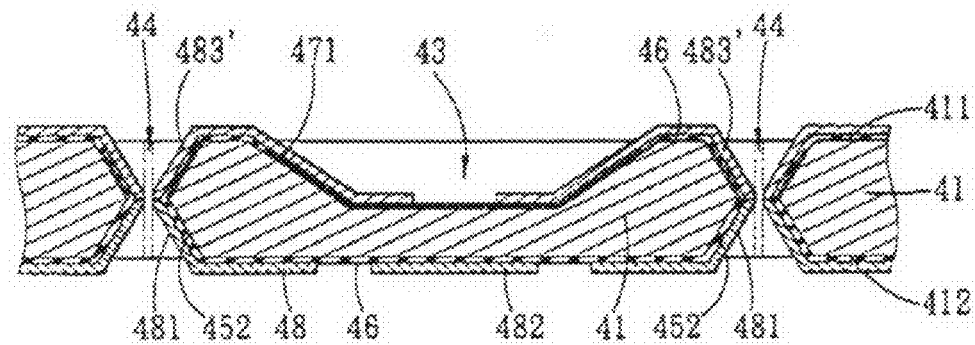
FIGS. 12 (a) and 12 (b) are cross-sectional views illustrating steps following the steps shown in FIG. 11 (a) to FIG. 11 (d) according to the method for packaging the light emitting diode of the fourth embodiment of the present invention.

The fourth embodiment is directed to another method for packaging the light emitting diode chip 1' (referring to FIG. 9). In this embodiment, some steps are the same as those shown in FIG. 11 (a) to FIG. 11 (d) of the third embodiment. Referring to FIG. 12(a), subsequent to the step shown in FIG. 11 (d), a conductive pattern 48 with predetermined patterns is formed on the lower surface 412 of the package substrate 41. The conductive pattern 48 for each package structure 4 (FIGS. 11 & 12) includes two lower conductive portions 481 and a conductive portion 482. Each lower conductive portion 481 extends from the lower surface 412 of the package substrate 41 to the corresponding lower inclined face 452 of the via hole 44. The conductive portion 482 is disposed on lower surface 412 of the package substrate 41 for connecting an external heat sink (not shown). After predetermined positions of the second conductive portions 1513', 1523' of the first and second electrode units 151', 152', that are disposed on the bottom surface of the light emitting diode chip 1', are defined in the reflective cup 471, two upper conductive portions 483' are formed by a metallization process such that the two upper conductive portions 483' extend to the corresponding upper inclined faces 451 from the predetermined positions (not labeled) of the first and second electrode units 151', 152' and are correspondingly connected to the two lower conductive portions 481. Similarly, the conductive pattern 48 and the upper conductive portions 483' can be made by a lift-off process.

Figure 12B:
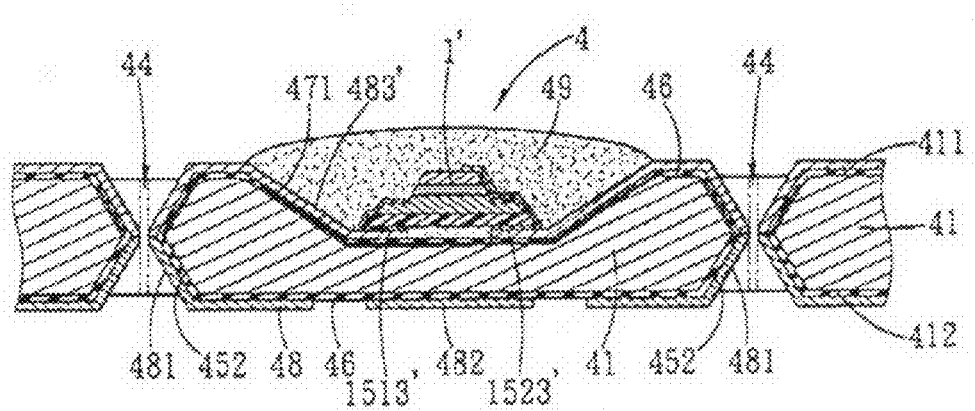
Figure 13A:
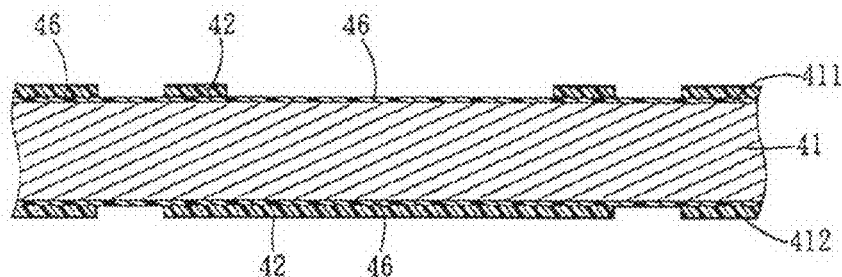
FIG. 13 (a) to FIG. 13 (h) are cross-sectional views illustrating steps of the method for packaging the light emitting diode according to the fifth embodiment of the present invention.
Figure 13B:
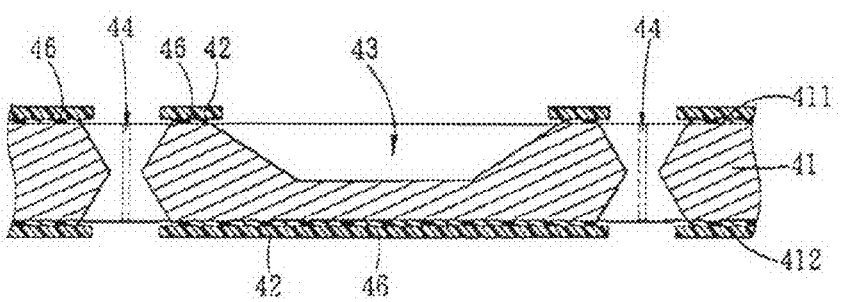
Figure 13C:
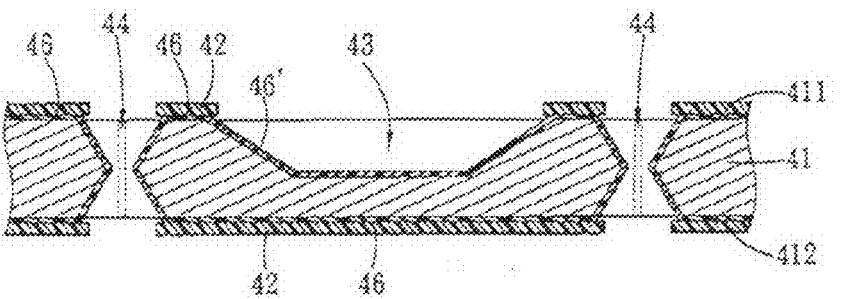
Figure 13D:
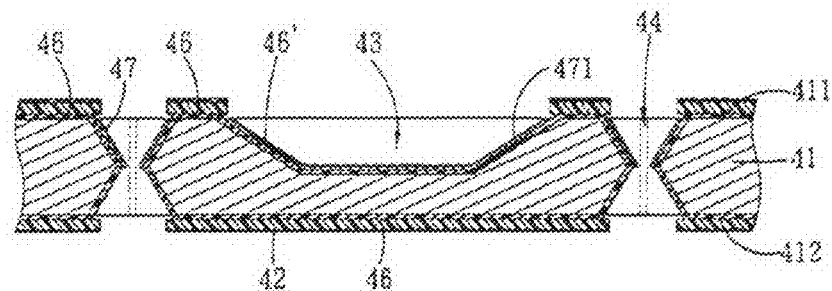
Figure 13E:
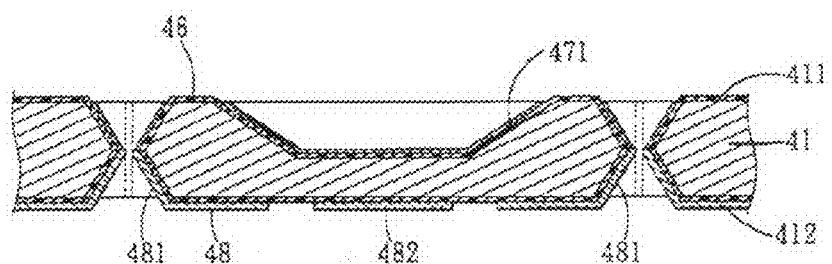
Figure 13F:
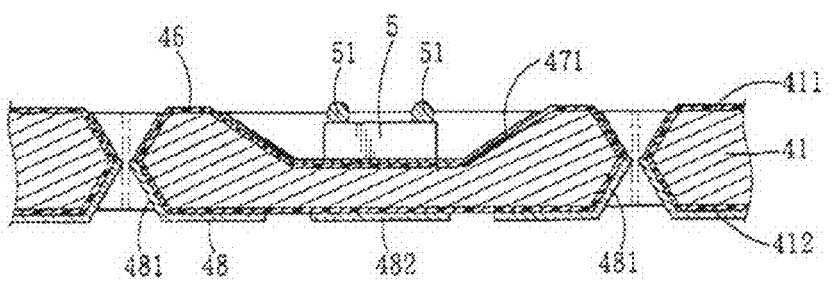
Figure 13G:
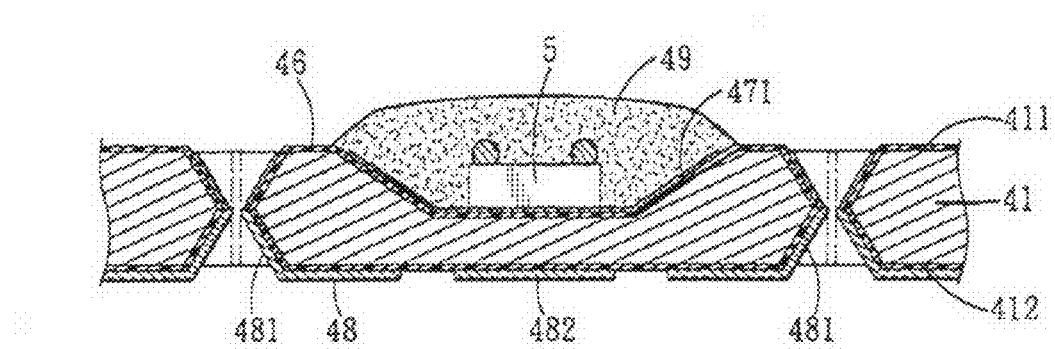
Figure 13H:
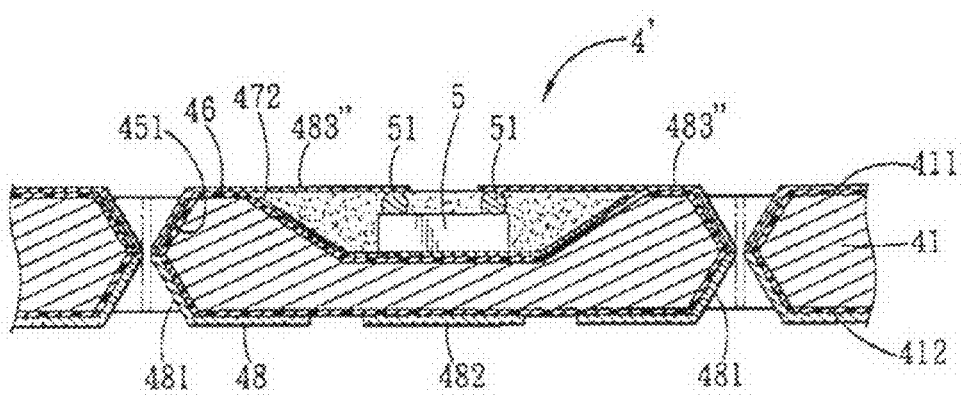

Referring to FIG. 12 (b), the light emitting diode chip is mounted in the reflective cup 471 such that the two second conductive portions 1513', 1523' of the first and second electrode units 151', 152' are correspondingly electrically connected to the two upper conductive portions 483'. That is, the upper conductive portions 483' are correspondingly electrically connected to the first and second electrode units 151, 152. Finally, a light-transmissive encapsulant 49 is filled into the reflective cup 471 to encapsulate the light emitting diode chip 1'. The light-transmissive encapsulant 49 can include or exclude fluorescent powder, based on user requirements.

FIG. 13 (a) to FIG. 13 (h) illustrate the steps employed in the method for packaging the light emitting diode of the fifth embodiment according to the present invention. The method of the fifth embodiment can be used in packaging a conventional light emitting diode chip 5 having electrodes located on a top face thereof.

Referring to FIG. 13 (a) and FIG. 13 (b), the steps for forming the cavity 43 and the two via holes 44 on the package substrate 41 are the same as those shown in FIG. 11 (a) and FIG. 11 (b). However, in this embodiment, the insulating layer 46 is formed between the protection portions 42 and the package substrate 41.

Referring to FIG. 13 (c), the cavity 43 and the two via holes 44 have exposed surfaces that are oxidized to form an insulating layer 46'.

Referring to FIG. 13 (d), a metal layer 47 is deposited on the upper surface 411 of the package substrate 41 such that the metal layer 47 covers the surfaces of cavity 43 and the via holes 44. A portion of the cavity 43 adjacent to the protection portion 42 is not covered by the metal layer 47. By this step, a reflective cup 471 is formed in the cavity 43.

Referring to FIG. 13 (e), the protection portions 42 on the upper and lower surfaces 411, 412 of the package substrate 41 are removed, and a conductive pattern 48 with predetermined patterns is formed on the lower surface 412 of the package substrate 41. The conductive pattern 48 for each package structure 4' (FIG. 13h) includes two lower conductive portions 481 and a conductive portion 482. Each lower conductive portion 481 extends from the lower surface 412 of the package substrate 41 to one of the lower inclined faces 452. The conductive portion 482 is disposed on the lower surface 412 of the package substrate 41 for connecting an external heat sink (not shown).

Referring to FIG. 13 (f), the light emitting diode chip 5 is mounted in the reflective cup 471, and two conductive pieces 51 are correspondingly disposed on two electrodes (not shown) of the light emitting diode chip 5, such that the conductive pieces 51 protrude out of the reflective cup 471. In this embodiment, each of the conductive pieces 51 is a metal ball, i.e., a golden ball, with a height ranging from 50 to 100 μm. Although, in this embodiment, the conductive pieces 51 are disposed on the chip 5 after the light emitting diode chip 5 mounted in the reflective cup 47, it is also possible to mount the light emitting diode chip 5 in the reflective cup 47 after the conductive pieces 51 are disposed on the chip 5. However, the entire height of the light emitting diode chip 5 plus the conductive pieces 51 should be larger than the depth of the reflective cup 471.

As shown in FIG. 13 (g), a light-transmissive encapsulant 49 is filled into the reflective cup 471 to encapsulate the light emitting diode chip 5. The light-transmissive encapsulant 49 can include or exclude fluorescent powder, based on user requirements.

Figure 14:
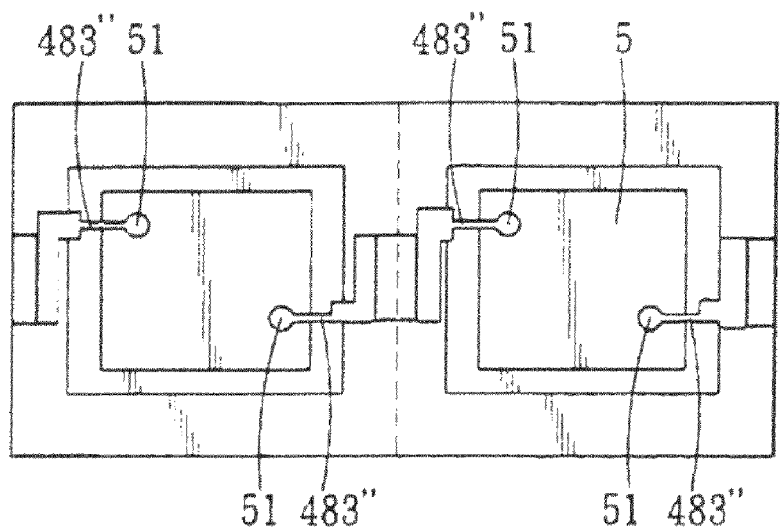
FIG. 14 is a top view of FIG. 13 (h) for illustrating positions of upper conductive portions of the light emitting diode chip in the fifth embodiment.

As shown in FIG. 13 (h), after the light-transmissive encapsulant 49 is cured, the cured light-transmissive encapsulant 49 is polished so as to partially expose the conductive pieces 51 from a polished surface of the light-transmissive encapsulant 49. Surfaces of the conductive pieces 51 exposed from the polished surface of the light-transmissive encapsulant 49 are higher than an opening 472 of the reflective cup 471. Referring to FIG. 13 (h) and FIG. 14, two upper conductive portions 483" are formed by a metallization process. The upper conductive portions 483" are correspondingly connected to the two conductive pieces 51 and extend to the upper inclined faces 451 such that the upper conductive portions 483" are electrically connected to the corresponding electrodes (not shown) and the corresponding lower conductive portions 481. Thereafter, like the third embodiment, the package substrate 41 can be cut into several independent package structures 4'.

Figure 15:
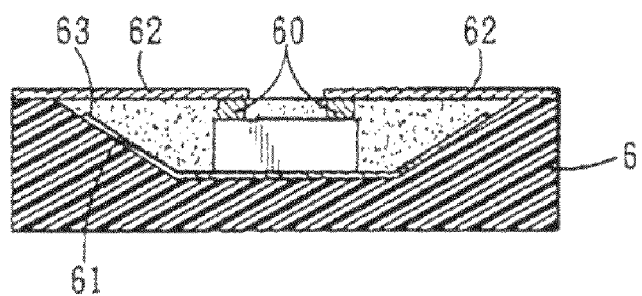
FIG. 15 is a cross-sectional view illustrating another packaging configuration of the light emitting diode chip according to the fifth embodiment of the present invention.

The steps shown in FIG. 13 (f) to FIG. 13 (h) can be applied to a conventional reflective cup. As shown in FIG. 15, when a reflective cup 61 is provided on a conventional package substrate 6, the two upper conductive portions 483" of FIG. 13 (h) can serve as two conductive extension portions 62 that extend externally of an opening 63 of the reflective cup 61 for electrical connection with external electrodes (not shown).

In summary, the methods for making the light emitting diode chip 1, 1' are respectively conducted by the metallization process to deposit the conductive portions 1512, 1512' on the inclined sidewalls 13 and the substrate inclined walls 14. Deposition of the conductive portions on the inclined surfaces according to the invention can be controlled more easily compared to the deposition of a conductive portion on a vertical face. With the invention, the production yield rate can be improved, and the production cost can be reduced.

Besides, in the light emitting diode chip 1, 1' of the present invention, since the conductive portions 1512, 1522, 1512', 1522' of the electrodes 1511, 1521, 1511', 1521' extend to the substrate inclined walls 14 by virtue of the inclined plane units 16, 16', the distance of the conductive portions 1512, 1522, 1512', 1522' from the corresponding conductive extension portions 35 for external electrical connection can be decreased, and the possibility of wire breakage can be reduced.

Furthermore, because the conductive portions 1512, 1522 connected to the corresponding electrodes 1511, 1521 can extend to the substrate inclined walls 14 by virtue of the inclined plane units 16, because the conductive portions 1513', 1523' extend to the bottom surface 111' of the substrate 11', and because the conductive extension portions 35, 35' are electrically connected to the light emitting diode chip 1, 1' by the metallization process, a wire bonding process can be dispensed with in the present invention. Thus, the method of the present invention is suitable for a system in package or wafer level package, saves the time for wire bonding, saves the space for wire bonding, reduces the packaging volume, provides advantages for miniaturization of photoelectric components, and contributes flexibility to integrate with other LED technologies, such as nano-crystal coating process.

According to the first to fifth embodiments, the methods for packaging the light emitting diode in this invention do not require any wire bonding step, and can be utilized in a system in package or wafer level package. Based on the structure of the light emitting diode chip 1, 1', or 5, an appropriate method can be selected from the above embodiments. Moreover, according to the third to fifth embodiments, the package structure 4, 4' can be directly assembled on a printed circuit board of the end product without using the wire bonding process. Therefore, the package structures 4, 4' in this invention are beneficial for assembling processes in downstream applications.

In addition, application of the packaging method, the package substrate, and the reflective cup shown in FIG. 7 (a) to FIG. 7 (d), FIG. 10 (a), FIG. 11 (a) to FIG. 11 (e), FIG. 12 (a), and FIG. 13 (a) to FIG. 13 (e) should not be limited to the light emitting diode chip 1, 1' and can be extended to the conventional light emitting diode chip.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for manufacturing a light emitting diode chip, comprising the steps of:
providing a substrate;
forming an epitaxial layer structure on the substrate, the epitaxial layer structure including a first type semiconductor layer different in material composition from the substrate formed on an upper surface of the substrate, a second type semiconductor layer disposed above the first type semiconductor layer, and a light emitting layer sandwiched between the first and second type semiconductor layers;
etching the epitaxial layer structure to expose portions of said upper surface of the substrate and to form epitaxial layer units, each epitaxial layer unit being formed with inclined sidewalls extending in inclined fashion downwardly and outwardly at opposite sides of said each epitaxial layer unit;
etching the upper surface of said substrate at said exposed portions thereof to form substrate cavities extending in said substrate, where each of said substrate cavities has at least one substrate inclined wall extending in said substrate;
forming two electrode units, each on a respective one of said inclined walls of said each epitaxial layer unit, said each electrode unit including an electrode disposed on and connected to a respective one of the first and second type semiconductor layers, and a first conductive portion formed simultaneously and integrally with said electrode and extending along a corresponding one of the inclined sidewalls of said each epitaxial layer unit to and along said at least one substrate inclined wall of a respective one of the substrate cavities beyond said epitaxial layer unit;
before the step of forming said two electrode units, forming an insulating layer disposed between the first conductive portion of one of the two electrode units connected to the second type semiconductor layer, and a corresponding one of the inclined sidewalls of said each epitaxial layer unit; and
polishing a bottom surface of the substrate until the first conductive portions of the two electrode units are exposed at the polished bottom surface.

2. The method of claim 1, further comprising the step of:
forming at least one second conductive portion on the polished bottom surface of the substrate in connection with at least one of the first conductive portions.

3. The method of claim 1, wherein adjacent ones of said at least one substrate inclined wall and the inclined sidewall are inclined in the same direction.

4. The method of claim 1, wherein the step of etching the epitaxial layer includes:
etching the second type semiconductor layer, the light emitting layer, and the first type semiconductor layer until the portions of said upper surface of said substrate are exposed such that each of the inclined sidewalls has a first inclined surface extending downwardly from a side of the second type semiconductor layer to a part of a side of the first type semiconductor layer and a second inclined surface formed on a remaining part of the side of the first type semiconductor layer.

5. The method of claim 4, wherein the step of etching the first type semiconductor layer further includes:
forming a shoulder face on the first type semiconductor layer for interconnecting the first and second inclined surfaces.

6. The method of claim 1, wherein the polished bottom surface of the substrate is substantially flush with the first conductive portions.

7. A method for manufacturing a light emitting diode, the method comprising: forming a light emitting diode chip using steps including: providing a substrate; forming an epitaxial layer structure on the substrate, the epitaxial layer structure including a first type semiconductor layer different in material composition from the substrate formed on an upper surface of the substrate, a second type semiconductor layer disposed above the first type semiconductor layer, and a light emitting layer sandwiched between the first and second type semiconductor layers; etching the epitaxial layer structure to expose portions of said upper surface of the substrate and to form epitaxial layer units, each epitaxial layer unit being formed with inclined sidewalls extending in inclined fashion downwardly and outwardly at opposite sides of said each epitaxial layer unit; etching the upper surface of said substrate at said exposed portions thereof to form substrate cavities extending in said substrate, where each of said substrate cavities has at least one substrate inclined wall extending in said substrate; forming two electrode units, each on a respective one of said inclined walls of said each epitaxial layer unit, said each electrode unit including an electrode disposed on and connected to a respective one of the first and second type semiconductor layers, and a first conductive portion formed simultaneously and integrally with said electrode and extending along a corresponding one of the inclined sidewalls of said each epitaxial layer unit to and along said at least one substrate inclined wall of a respective one of the substrate cavities beyond said epitaxial layer unit; before the step of forming said two electrode units, forming an insulating layer disposed between the first conductive portion of one of the two electrode units connected to the second type semiconductor layer, and a corresponding one of the inclined sidewalls of said each epitaxial layer unit; and polishing a bottom surface of the substrate until the first conductive portions of the two electrode units are exposed at the polished bottom surface; providing a package substrate; forming a cavity and two via holes proximate to the cavity in the package substrate, each of the via holes defining a via-hole sidewall having an upper inclined face tapering downwardly from an upper surface of the package substrate toward a middle part of a respective one of the via holes, and a lower inclined face tapering upwardly from a lower surface of the package substrate toward the middle part of the corresponding one of the via holes; forming a reflective cup in the cavity; mounting the light emitting diode chip in the reflective cup; forming two lower conductive portions extending from the lower surface of the package substrate to the lower inclined faces of the two via holes, respectively; forming two upper conductive portions respectively extending to the upper inclined faces of the two via holes and respectively connecting to the two lower conductive portions; and electrically connecting the two upper conductive portions to two electrodes of the light emitting diode chip.

8. The method of claim 7, wherein the conductive portions of the two electrode units extend to the bottom surface of the substrate, and are connected respectively and electrically to the two upper conductive portions.

9. The method of claim 7, further comprising a step of assembling two conductive pieces respectively on the two electrodes of the light emitting diode chip, the step of assembling including the following sub-steps: placing the two conductive pieces respectively on the two electrodes of the light emitting diode chip, whereby the conductive pieces protrude out of the reflective cup; filling a light-transmissive encapsulant into the reflective cup to encapsulate the light emitting diode chip; curing the light-transmissive encapsulant; and polishing the cured light-transmissive encapsulant to expose the conductive pieces from the polished light-transmissive encapsulant for electrical connection with the corresponding upper conductive portions.

10. The method of claim 7, wherein the step of forming the two via holes is conducted by etching the upper and lower surfaces of the package substrate in opposite directions.

11. The method of claim 7, wherein the forming of the cavity and the two via holes includes the steps of: forming protection portion respectively on the upper and lower surfaces of the package substrate; forming a plurality of through holes in each of the protection portions to predefine the locations of the cavity and the two via holes; and etching the package substrate to form the cavity and the two via holes.

12. The method of claim 11, wherein the forming of the reflective cup includes the steps of: arranging an opening of the cavity to be larger than a respective one of the through holes, whereby the protection portion projects into the cavity; depositing a metal layer on the upper surface of the package substrate, whereby the metal layer does not cover a portion of the cavity in proximity to the protection portion; and removing the protection portions on the upper and lower surfaces, whereby the reflective cup is formed in the cavity.

13. The method of claim 12, further comprising a step of forming an insulating layer after the forming of the reflective cup, wherein the upper and lower conductive portions are respectively formed on the insulating layer.

\* \* \* \* \*